(12) United States Patent
Chun

(10) Patent No.: US 6,856,173 B1
(45) Date of Patent: Feb. 15, 2005

(54) MULTIPLEXING OF DIGITAL SIGNALS AT MULTIPLE SUPPLY VOLTAGES IN AN INTEGRATED CIRCUIT

(75) Inventor: Christopher K. Chun, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 7 days.

(21) Appl. No.: 10/656,051

(22) Filed: Sep. 5, 2003

(51) Int. Cl.[7] .......................................... H03K 19/084
(52) U.S. Cl. ..................... 326/108; 326/105; 326/81; 326/68; 326/113; 327/333
(58) Field of Search ................. 326/108, 113, 326/105, 68, 63, 81; 327/333

(56) References Cited

U.S. PATENT DOCUMENTS

| | | | | |
|---|---|---|---|---|
| 5,534,798 A | * | 7/1996 | Phillips et al. | 326/108 |
| 5,973,955 A | * | 10/1999 | Nogle et al. | 365/154 |
| 6,020,760 A | | 2/2000 | Sample | |
| 6,285,211 B1 | | 9/2001 | Sample | |
| 6,346,829 B1 | * | 2/2002 | Coddington | 326/81 |
| 6,509,758 B2 | | 1/2003 | Piasecki | |
| 6,535,018 B1 | * | 3/2003 | Kost | 326/68 |
| 6,710,621 B2 | * | 3/2004 | Devlin et al. | 326/38 |
| 2002/0153923 A1 | | 10/2002 | Piasecki | |

* cited by examiner

Primary Examiner—Vibol Tan
(74) Attorney, Agent, or Firm—Daniel D. Hill; David G. Dolezal

(57) ABSTRACT

An integrated circuit (10) includes a multiple voltage digital multiplexer circuit (30) for multiplexing digital signals provided at different supply voltage levels. In one form, the multiplexer (30) includes an analog multiplexer (32) for receiving the digital signals, a level shifter (40) coupled to the output of the analog multiplexer (32), and a supply voltage multiplexer (34) for providing one of various supply voltages used on the IC corresponding to the signals being multiplexed. A control circuit (38, 39) is used to control the input selection of the analog multiplexer (32) as well as the supply voltage multiplexer (34) for providing the correct supply voltage to the level shifter (40). This provides the ability to multiplex digital signals of differing voltage levels onto a single pad on the IC (10).

33 Claims, 3 Drawing Sheets

MULTIPLEXING OF DIGITAL SIGNALS AT MULTIPLE SUPPLY VOLTAGES IN AN INTEGRATED CIRCUIT

FIELD OF THE INVENTION

This invention relates to generally to integrated circuits (ICs), and more particularly, to multiplexing digital signals at multiple supply voltage levels in an integrated circuit.

BACKGROUND OF THE INVENTION

In integrated circuit (IC) manufacturing, a semiconductor die is provided with terminals, commonly referred to as pads, for communicating with a user or other circuits in an application. The die may be housed in a package having user accessible terminals for mounting on a substrate or a printed circuit board. Various methods are used to couple the die pads to the terminals of the package, such as for example, wirebonds or solder balls. Frequently, complex integrated circuit designs incorporate more functions on a single integrated circuit die than can easily be coupled to the user accessible terminals, or pins, on the integrated circuit package housing the die. In some cases, the various signals on the integrated circuit die can be multiplexed to the user accessible terminals using simple digital multiplexers. However, many ICs today include digital circuits requiring more than one supply voltage. For example, a digital signal from one part of the IC may be from a circuit operating from one supply voltage level (for example 1.0 volt), and a digital signal from another part of the IC may be from a circuit operating at another supply voltage level (for example 1.6 volts). Because of the difference in supply voltage levels, a simple digital multiplexer may not be able to reliably multiplex these signals.

Therefore, there is a need for a multiplexing circuit in an IC that can multiplex digital signals that are provided at different supply voltage levels.

DETAILED DESCRIPTION OF THE PREFERRED EMBODIMENT

Generally, the present invention provides a multiplexer circuit that can multiplex digital signals provided at different supply voltage levels. The multiplexer circuit includes an analog multiplexer for receiving the digital signals, a level shifter coupled to the output of the analog multiplexer, and a supply voltage multiplexer for providing one of various supply voltages used on the IC corresponding to the signals being multiplexed. A control circuit is used to control the input selection of the analog multiplexer as well as the supply voltage multiplexer for providing the correct supply voltage to the level shifter. This provides the ability to multiplex digital signals of differing voltage levels onto a single pad on the IC.

Figure 1:
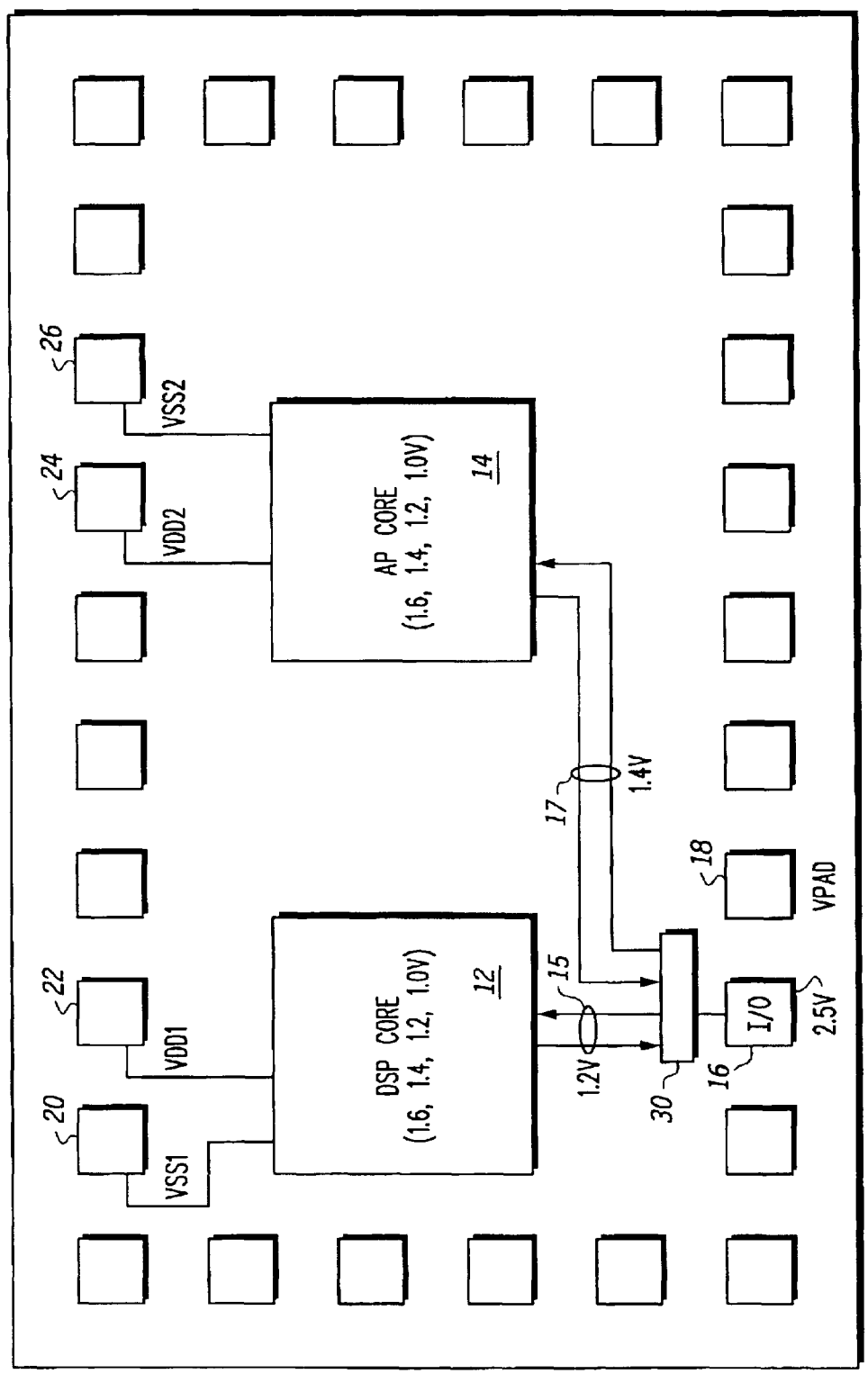
FIG. 1 illustrates, in block diagram form, an integrated circuit die having a multiple voltage multiplexer in accordance with the present invention.

FIG. 1 illustrates, in block diagram form, an integrated circuit die 10 having a multiple voltage multiplexer 30 in accordance with the present invention. In the illustrated embodiment, integrated circuit die 10 includes a digital signal processor (DSP) core 12, an application processor (AP) core 14, and a plurality of pads. DSP core 12 and AP core 14 operate independently of each other. Also, DSP core 12 and AP core 14 may operate at one or more supply voltage levels (1.6, 1.4, 1.2, and 1.0 volts). The plurality of pads are arranged around a perimeter of IC 10, and are user accessible terminals for providing electrical connections for the various signals and supply voltages communicated to and from IC 10. In FIG. 1, the plurality of pads include a representative input/output (I/O) pad 16, and representative power supply pads 18, 20, 22, 24, and 26. Power supply pad 18 receives a power supply voltage labeled "VPAD", power supply pad 20 is coupled to ground and labeled "VSS1", power supply pad 22 is coupled to receive a power supply voltage labeled "VDD1", power supply pad 24 is coupled to receive a power supply voltage labeled "VDD2", and power supply pad 26 is coupled to ground and labeled "VSS2". As illustrated in FIG. 1, DSP core 12 may operate at 1.6 volts, 1.4 volts, 1.2 volts, and 1.0 volt depending on the operating mode. Likewise, AP core 14 may operate at 1.6 volts, 1.4 volts, 1.2 volts, and 1.0 volt depending on the operating mode. Furthermore, DSP core 12 and AP core 14 may operate at different supply voltage levels at the same time.

Integrated circuit 10 may include many more signals than there are external pins available on a package. For example, in one embodiment, IC 10 may include 500 or more signals to be multiplexed to only 300 pins. FIG. 1 illustrates only one simple example of multiple signals being multiplexed to one pin in accordance with the present invention. In the example illustrated in FIG. 1, DSP core 12 includes a plurality of signal lines 15 for conducting a plurality of digital signals at a supply voltage level of 1.2 volts. AP core 14 includes a plurality of signal lines 17 for conducting a plurality of digital signals at a supply voltage level of 1.4 volts. Generally, a digital signal is a "rail-to-rail" signal. That is, if the digital signal is provided from a circuit operating with a supply voltage of, for example, 1.4 volts, then a logic "one" is a 1.4 volt signal and a logic "zero" is a zero volt signal. The pluralities of signal lines 15 and 17 are coupled to input and output terminals, as the case may be, of multiple voltage multiplexer 30. Multiplexer 30 selectively controls which one of the pluralities of signals 15 and 17 communicates via I/O pad 16, and performs a voltage translation from the internal voltage, such as for example, 1.2 or 1.4 volts; to 2.5 volts. The operation of multiplexer circuit 30 will be described in more detail below.

Note that integrated circuit die 10 may include additional circuitry (not shown). In the illustrated embodiment, IC 10 is a baseband integrated circuit for wireless devices. In the case of a wireless device, the additional circuitry may include, for example, one or more memories, display control circuits, timers, debug and test circuits, analog circuits, etc. In other embodiments, IC 10 may include circuitry other than a DSP core and an AP core. Or, the IC may have only one core. Also, the IC may be, for example, an application specific integrated circuit (ASIC) having circuit portions that operate at one supply voltage level and circuit portions that operate at another supply voltage level. In addition, the IC may include different memory types that require different voltage levels.

Figure 2:
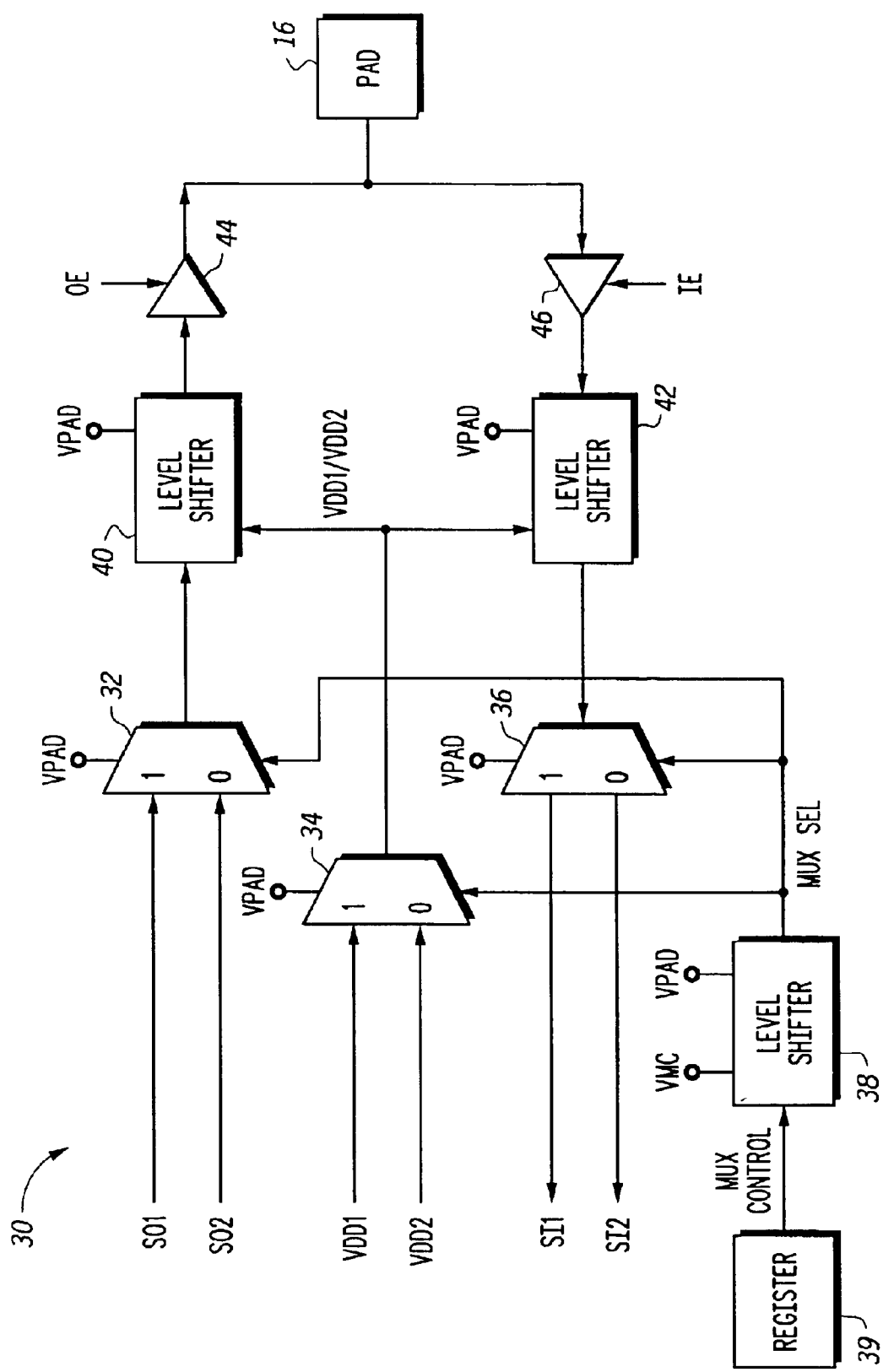
FIG. 2 illustrates, in block diagram form, the multiplexer of FIG. 1 in more detail.

FIG. 2 illustrates, in block diagram form, multiple voltage multiplexer 30 of FIG. 1 in more detail. Multiple voltage multiplexer 30 includes analog multiplexers 32, 34, and 36, level shifters 38, 40, and 42, register 39, output buffer 44, input buffer 46, and pad 16. Each of analog multiplexers 32, 34, and 36, input buffer 46, output buffer 44, and a portion of level shifters 38, 40, and 42 are supplied by power supply voltage VPAD. An output path includes analog multiplexer 32, level shifter 40 and output buffer 44. Analog multiplexer 32 receives digital output signals labeled "SO1" and "SO2". Signals SO1 and SO2 may be from DSP core 12 or from AP core 14, or from another circuit (not shown) of IC 10. In the illustrated embodiment, SO1 is from a circuit operating at supply voltage VCC1, and SO2 is from a circuit operating at supply voltage VCC2. In other embodiments, digital signals SO1 and SO2 may be from circuits supplied with the same supply voltage or from circuits supplied by different supply voltages.

A control terminal of analog multiplexer 32 receives a multiplexer select signal labeled "MUX SEL". The MUX SEL signal determines which of digital signals SO1 and SO2 are coupled to the output of analog multiplexer 32. The output terminal of analog multiplexer 32 is coupled to an input of level shifter 40. In addition to controlling analog multiplexers 32 and 36, the MUX SEL signal is provided to the control terminal of multiplexer 34 for setting the voltage level of portions of level shifters 40 and 42 (see FIG. 3), where the voltage level corresponds to the supply voltage level of the selected digital signal SO1 or SO2, that is, supply voltage VCC1 or supply voltage VCC2.

A programmable register 39 is used to provide a control signal labeled "MUX CONTROL" to control the multiplexers and level shifters. Signal MUX SEL depends on signal MUX CONTROL. That is, the logic level of the MUX SEL signal is determined by the MUX CONTROL signal. Note that level shifter 38 is optionally provided because the MUX CONTROL signal may originate from a circuit having a different supply voltage than VPAD. Programmable register 39 may include one or more bits, each bit for selecting from one or more voltage levels. In the illustrated embodiment, the voltage level of level shifters 40 and 42 is set by selecting one of VDD1 or VDD2 via analog multiplexer 34. For example, if signal SO1 is selected at multiplexer 32, then supply voltage VDD1 will be provided to level shifter 40. Likewise, if signal SO2 is selected at multiplexer 32, then supply voltage VDD2 will be provided to level shifter 40. Level shifter 38 is similar to level shifters 40 and 42, and will be discussed below in more detail in the discussion of FIG. 3. The operation of analog multiplexer 32 will be discussed below in more detail in the discussion of FIG. 4.

Still referring to FIG. 2, the level shifted digital signal from level shifter 40 is provided to an input of buffer circuit 44, and in response, a buffered digital signal at the VPAD power supply voltage is provided to pad 16 when output enable signal OE is asserted.

Similarly, an input path of multiplexer 30 includes input buffer 46, level shifter 42, and analog multiplexer 36. Note that in the illustrated embodiment, analog multiplexer 36 performs a de-multiplexing function. A digital input signal is received at pad 16 at the pad voltage level VPAD. The digital input signal is provided to an input of input buffer circuit 46. A buffered input signal is provided at the output of buffer 46 to an input of level shifter 42 when input enable signal IE is asserted. Input enable signal IE and output enable signal OE are provided by control circuitry that is not shown. Control signal MUX SEL, which is derived from control signal MUX CONTROL, as discussed above, selects an output of multiplexer 36, either SI1 or SI2. Also, the MUX SEL signal selects the corresponding supply voltage, either VDD1 or VDD2, via multiplexer 34. A level shifted digital signal at the proper voltage level is then provided to internal circuits of IC 10 via analog de-multiplexer 36.

Note that the multiplexers 32 and 34 of FIG. 2 each have two inputs and de-multiplexer 36 had two outputs. In other embodiments, the multiplexers and de-multiplexers may have more than two inputs or outputs, respectively, depending on the number signals to be multiplexed and on the number of possible supply voltages used by the multiplexed signals.

Figure 3:
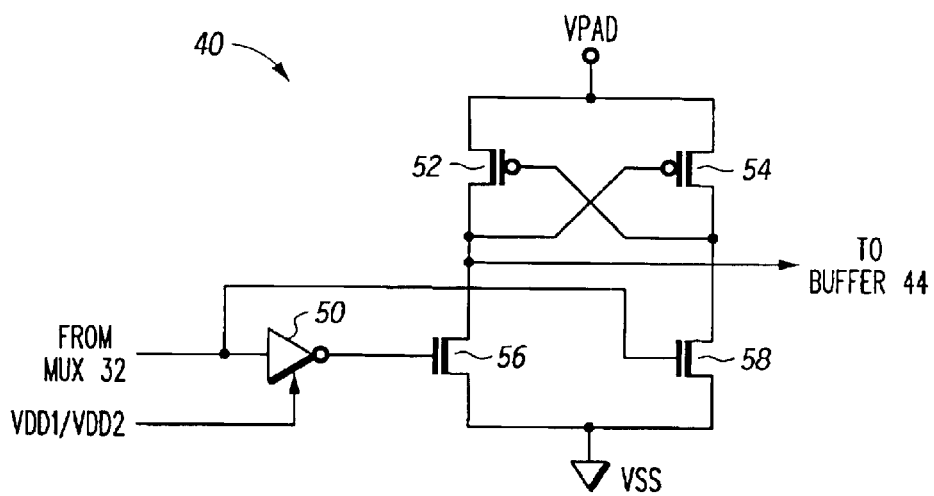
FIG. 3 illustrates, in schematic diagram form, a level shifter of the multiplexer of FIG. 2.

FIG. 3 illustrates, in schematic diagram form, one embodiment of level shifter 40 of the multiplexer of FIG. 2. Note that level shifters 38 and 42 are similar to level shifter 40. Level shifter 40 includes inverter 50, P-channel transistors 52 and 54, and N-channel transistors 56 and 58. Inverter 50 receives either VDD1 or VDD2 as a supply voltage as determined by control MUX SEL. The particular supply voltage corresponds to the voltage level of a digital signal being provided from the output of multiplexer 32. Transistors 52, 54, 56, and 58 form an amplifier. The amplifier is coupled to the power supply voltage VPAD. An output of the amplifier is coupled to input buffer 44 (see FIG. 2). Using level shifter 40, a signal at voltage level VDD1 or VDD2 is translated, or level shifted to voltage level VPAD. In the illustrated embodiment, VDD1 and VDD2 are at a lower voltage potential than VPAD, however, in other embodiments, VDD1 and VDD1 may be at a higher voltage potential.

In the case where a digital signal from multiplexer 32 is a logic high voltage from a circuit being supplied by, for example, VCC1, inverter 50 provides a logic low voltage to the gate of N-channel transistor 56. N-channel transistor 56 is substantially non-conductive or "OFF". The gate of N-transistor 58 is supplied with the logic high voltage from multiplexer 32 at VCC1 and N-channel transistor 58 is conductive or "ON". The gate of P-channel transistor 52 is pulled low through transistor 58, causing P-channel transistor 52 to be ON, thus pulling the output of the amplifier up to a logic high equal to about voltage VPAD.

Conversely, if the digital signal from multiplexer 32 is a logic low, N-channel transistor 56 is "ON" and N-channel transistor 58 is "OFF". The gate of P-channel transistor 54 is pulled low through transistor 56, causing P-channel transistor 54 to be ON. The gate of P-channel transistor 52 is pulled high through P-channel transistor 54, causing P-channel transistor 52 to be OFF. The output of the amplifier is pull to a logic low through N-channel transistor 56.

Level shifter 40, as illustrated in FIG. 3, is just one example of a level shifter that can be used with multiplexer circuit 30. In other embodiments, a different type of level shifter may be used for translating a digital signal from one voltage level to another voltage level.

Figure 4:
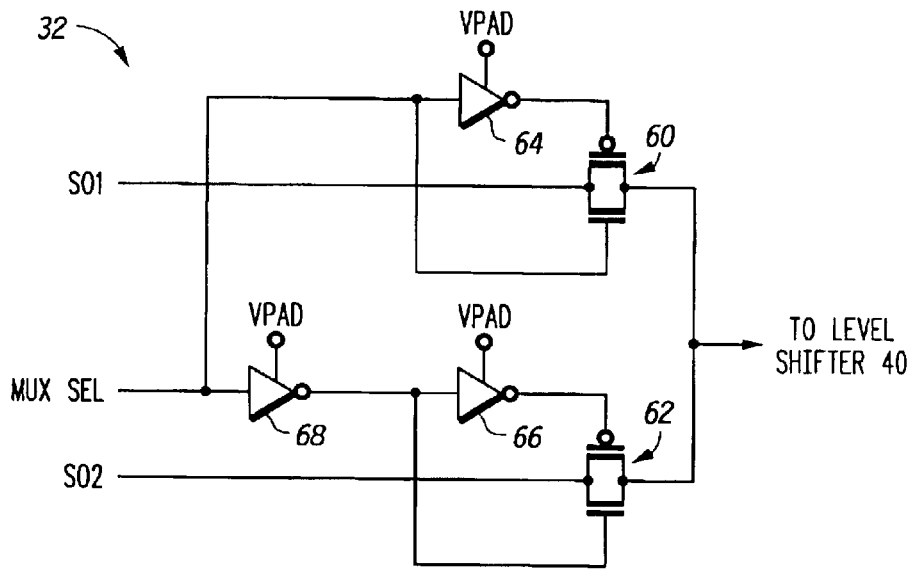
FIG. 4 illustrates, in schematic diagram form, an analog multiplexer circuit of the multiplexer of FIG. 2.

FIG. 4 illustrates, in schematic diagram form, one embodiment of analog multiplexer circuit 32 of multiplexer 30 of FIG. 2. Analog multiplexers 34 and 36 are similar to analog multiplexer 32. Analog multiplexer 32 includes inverters 64, 66, and 68, and transmission gates 60 and 62. Transmission gates 60 and 62 each comprise parallel-connected N-channel and P-channel transistors. Each of the inverters is a conventional CMOS (complementary metal oxide semiconductor) inverter supplied by power supply voltage VPAD. When the MUX SEL signal is a logic high voltage, transmission gate 60 is conductive and transmission gate 62 is substantially non-conductive. Digital signal SO1 is communicated to the input of level shifter 40. Also, when the MUX SEL signal is a logic low voltage, transmission gate 60 is substantially non-conductive and transmission gate 62 is conductive. Digital signal SO2 is communicated to the input of level shifter 40. The use of transmission gates 60 and 62 allow digital signals SO1 and SO2 to be transmitted without a threshold voltage drop. Note that in some embodiments, single transistor "pass" gates may be substituted for transmission gates 60 and 62.

Figure 5:
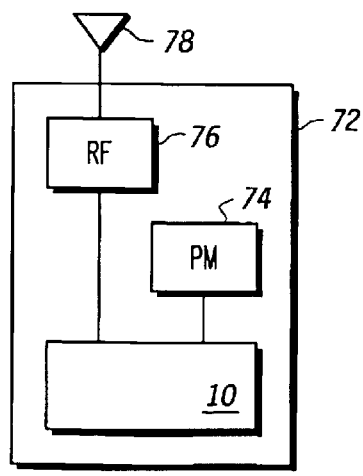
FIG. 5 illustrates, in block diagram form, a wireless device including the integrated circuit of FIG. 1.

FIG. 5 illustrates, in block diagram form, a wireless device 72 including integrated circuit 10. Wireless device 72 includes an RF (radio frequency) IC 76, a power management IC 74 in addition to integrated circuit 10. In the illustrated embodiment, wireless device 72 is a cellular telephone. In other embodiments, wireless device 72 may be any type of 2-way radio, such as for example, a walkie-talkie, 2-way pager, PDA (personal digital assistant), or personal computer, or any device for providing voice and/or data transmitting and/or receiving functions.

The present invention, as described herein, provides the ability to multiplex digital signals of differing voltage levels onto a single pad of an IC.

Various changes and modifications to the embodiments herein chosen for purposes of illustration will readily occur to those skilled in the art. For example, variations in the types of conductivities of transistors, the types of transistors, etc. may be readily made. To the extent that such modifications and variations do not depart from the scope of the invention, they are intended to be included within the scope thereof, which is assessed only by a fair interpretation of the following claims.

What is claimed is:

1. An integrated circuit die comprising:
    a multiplexer having a first terminal coupled to a first digital signal line that when at a first state is at a voltage dependent upon a first power supply voltage, a second terminal coupled to a second digital signal line that when at a first state is at voltage dependent upon a second power supply voltage, and a third terminal, the multiplexer receiving a control signal, the multiplexer coupling its third terminal to one of at least its first terminal or its second terminal based upon the control signal;
    a level shifter having a first signal terminal coupled to the third terminal of the multiplexer, a second signal terminal coupled to a third circuit, and a voltage supply terminal; and
    a second multiplexer having a first terminal coupled to receive a voltage dependent upon the first power supply voltage, a second terminal coupled to receive a voltage dependent upon the second power supply voltage, and a third terminal coupled to the voltage supply terminal of the level shifter, the second multiplexer receiving a second control signal, wherein the second multiplexer provides at its third terminal a voltage of one of at least a voltage of its first terminal or a voltage of its second terminal based upon the second control signal.

2. The integrated circuit die of claim 1 wherein the third circuit includes a pad of the integrated circuit die.

3. The integrated circuit die of claim 1 wherein the first control signal and the second control signal are dependent upon a common control signal.

4. The integrated circuit die of claim 3 wherein the first control signal and the second control signal are dependent upon a common control signal such that when the multiplexer couples its third terminal to its first terminal, the second multiplexer provides at its third terminal the voltage of its first terminal and; such that when the multiplexer couples its third terminal to its second terminal, the second multiplexer provides at its third terminal the voltage of its second terminal.

5. The integrated circuit die of claim 1 wherein the level shifter includes a second supply terminal coupled to receive a third voltage that is different from a voltage provided to the supply terminal of the level shifter.

6. The integrated circuit die of claim 5 wherein the third circuit is powered at the third voltage.

7. The integrated circuit die of claim 5 wherein the third voltage is higher than the voltage provided to the supply terminal of the level shifter.

8. The integrated circuit die of claim 1 further comprising:
    a first circuit having a terminal coupled to the first digital signal line, the first circuit being powered at the first power supply voltage; and
    a second circuit having a terminal coupled to the second digital signal line, the second circuit being powered at the second power supply voltage.

9. The integrated circuit die of claim 8 wherein the first circuit includes a digital signal processor core and the second circuit includes an application processor core.

10. The integrated circuit die of claim 1 further comprising:
    a control register for storing a control value, the control signal and the second control signal being dependent upon the control value.

11. The integrated circuit die of claim 10 further comprising:
    a second level shifter having a signal input coupled to an output of the control register to receive a signal indicative of the control value, wherein the second level shifter includes a signal output, wherein the control signal and the second control signal are dependent upon the output of the second level shifter.

12. The integrated circuit of die of claim 1 wherein the multiplexer and the second multiplexer each include a power supply terminal for receiving a third power supply voltage.

13. The integrated circuit die of claim 12 wherein the third circuit receives the third power supply voltage, wherein the level shifter includes a second voltage supply terminal coupled to receive the third power supply voltage.

14. The integrated circuit of claim 1 wherein the first multiplexer and the second multiplexer are characterized as being analog multiplexers.

15. The integrated circuit of claim 14 wherein the first multiplexer includes a pass gate.

16. The integrated circuit of claim 1 wherein:
    the first signal terminal of the level shifter is an input signal terminal of the level shifter.

17. The integrated circuit of claim 1 further comprising:
    a third multiplexer having a first terminal coupled to a third digital signal line that when at a first state is at a voltage dependent upon; the first power supply voltage, a second terminal coupled to a fourth digital signal line that when at a first state is at a voltage dependent upon the second power supply voltage, and a third terminal, the third multiplexer receiving a third control signal, the third multiplexer coupling the third terminal to one of at least its first terminal or its second terminal based upon the third control signal; and
    a second level shifter having a first signal terminal coupled the third terminal of the second multiplexer and a voltage supply terminal coupled to the third terminal of the second multiplexer.

18. The integrated circuit die of claim 17 wherein the first control signal, the second control signal, and the third control signal are dependent upon a common control signal.

19. The integrated circuit of claim 17 wherein:
the second level shifter includes a second signal terminal coupled to the third circuit;
the first signal terminal of the level shifter is an input signal terminal;
the second signal terminal of the level shifter is an output signal terminal;
the first signal terminal of the second level shifter is an output signal terminal; and
the second signal terminal of the second level shifter is an input signal terminal.

20. The integrated circuit of claim 19 wherein the third circuit includes an input/output pad of the integrated circuit die.

21. The integrated circuit of claim 17 wherein:
the first digital signal line is an output signal line of a first circuit;
the third signal line is an input signal line of the first circuit;
the second digital signal line is an output signal line of a second circuit; and
the fourth signal line is an input signal line of the second circuit.

22. A wireless device including the integrated circuit die of claim 1.

23. The wireless device of claim 22 wherein the wireless device performs voice and/or data transmitting and/or receiving functions.

24. A method of multiplexing digital signal lines comprising:
selecting one of at least a first digital signal line and a second digital signal line to couple to a signal terminal of a level shifter for conveying a digital signal between the level shifter and the one of the at least first digital signal line and the second digital signal line;
powering a first circuit coupled to the first digital signal line at a first power supply voltage, wherein when the first digital signal line is at a first state, the first digital signal line is at a voltage dependent upon the first power supply voltage;
powering a second circuit coupled to the second digital signal line at a second power supply voltage, wherein when the second digital signal line is at a first state, the second digital signal line is at a voltage dependent upon the second power supply voltage; and
selecting one of at least a first voltage and a second voltage to supply to a supply voltage terminal of the level shifter, wherein the first voltage is dependent upon the first power supply voltage and the second voltage is dependent upon the second power supply voltage, wherein the first voltage is selected when the first digital signal line is selected to be coupled to the signal terminal and the second voltage is selected when the second digital signal line is selected to be coupled to a signal terminal.

25. The method of claim 24 further comprising:
adjusting the voltage powering the first circuit to power the first circuit at a third power supply voltage, wherein the adjusting further includes supplying a third voltage dependent upon the third power supply voltage to the supply voltage terminal of the level shifter when the first digital signal line is selected.

26. The method of claim 24 wherein the selecting one of at least a first digital signal line and a second digital signal line and the selecting one of at least a first voltage and a second voltage further include writing to a control register a control value indicative of one of at least the first digital signal line and the second digital signal line.

27. The method of claim 24 further comprising:
providing by a first circuit a digital signal on the first digital signal line to the signal terminal of the level shifter when the first digital signal line is selected to be coupled to the signal terminal of the level shifter.

28. The method of claim 27 further comprising:
level shifting by the level shifter the digital signal received from the, first digital signal line when the first digital signal line is selected to be coupled to the signal terminal of the level shifter.

29. The method of claim 27 further comprising:
providing the digital signal from the level shifter to a pad of the integrated circuit.

30. The method of claim 24 further comprising:
receiving by a first circuit a digital signal on a first digital signal line when the first digital signal line is selected to be coupled to the signal terminal of the level shifter.

31. An integrated circuit die comprising:
a first digital signal line coupled to a first circuit receiving a first power supply voltage;
a second digital signal line coupled to a second circuit receiving a second power supply voltage;
a level shifter having a signal terminal and a supply voltage terminal;
means for selecting one of at least the first digital signal line and the second digital signal line to be coupled to the signal terminal of the level shifter; and
means for selecting one of at least a first voltage dependent upon the first power supply voltage and a second voltage dependent upon the second power supply voltage to supply the supply voltage terminal, wherein the first voltage is selected when the first digital signal line is selected to be coupled to the signal terminal of the level shifter and the second voltage is selected when the second digital signal line is selected to be coupled to the signal terminal of the level shifter.

32. The integrated circuit of claim 31 wherein the first digital signal line is an output signal line of the first circuit and the second digital signal line is an output signal line of the second circuit.

33. The integrated circuit die of claim 31 further comprising:
a third digital signal line coupled to the first circuit;
a forth digital signal line coupled to the second circuit;
a second level shifter having a signal terminal and a supply voltage terminal; and
means for selecting one of at least the third digital signal line and the fourth digital signal line to be coupled to the signal terminal of the second level shifter, wherein the third digital signal line is selected when the first voltage is selected and the fourth digital signal line is selected when the second voltage is selected;
wherein the first voltage is supplied to the supply voltage terminal of the second level shifter when the first voltage is selected and the second voltage is supplied to the supply voltage terminal of the second level shifter when the second voltage is selected.

* * * * *

UNITED STATES PATENT AND TRADEMARK OFFICE
CERTIFICATE OF CORRECTION

| | |
|---|---|
| PATENT NO. | : 6,856,173 B1 |
| APPLICATION NO. | : 10/656051 |
| DATED | : September 5, 2003 |
| INVENTOR(S) | : Christopher K Y Chun |

Page 1 of 1

It is certified that error appears in the above-identified patent and that said Letters Patent is hereby corrected as shown below:

Column 5, Line 66, Claim No. 4:
    Change "and; such that when" to --and such that when--

Column 6, Line 36, Claim No. 12:
    Change "circuit of die of claim" to --circuit die of claim--

Column 6, Line 54, Claim No. 17:
    Change "voltage dependent upon; the first" to --voltage dependent upon the first--

Column 8, Line 12, Claim No. 28:
    Change "received from the, first digital" to --received from the first digital--

Column 8, Line 48, Claim No. 33:
    Change "forth" to --fourth--

Signed and Sealed this

First Day of April, 2008

JON W. DUDAS
*Director of the United States Patent and Trademark Office*

UNITED STATES PATENT AND TRADEMARK OFFICE
CERTIFICATE OF CORRECTION

PATENT NO. : 6,856,173 B1  Page 1 of 1
APPLICATION NO. : 10/656051
DATED : February 15, 2005
INVENTOR(S) : Christopher K Y Chun It is certified that error appears in the above-identified patent and that said Letters Patent is hereby corrected as shown below:

Column 5, Line 66, Claim No. 4:
    Change "and; such that when" to --and such that when--

Column 6, Line 36, Claim No. 12:
    Change "circuit of die of claim" to --circuit die of claim--

Column 6, Line 54, Claim No. 17:
    Change "voltage dependent upon; the first" to --voltage dependent upon the first--

Column 8, Line 12, Claim No. 28:
    Change "received from the, first digital" to --received from the first digital--

Column 8, Line 48, Claim No. 33:
    Change "forth" to --fourth--

This certificate supersedes the Certificate of Correction issued April 1, 2008.

Signed and Sealed this

Sixth Day of May, 2008

JON W. DUDAS
*Director of the United States Patent and Trademark Office*